United States Patent
Cortes et al.

(10) Patent No.: US 11,245,032 B2
(45) Date of Patent: Feb. 8, 2022

(54) ASYMMETRIC FET FOR FDSOI DEVICES

(71) Applicant: GLOBALFOUNDRIES U.S. INC., Santa Clara, CA (US)

(72) Inventors: Ignasi Cortes, Barcelona (ES); Alban Zaka, Dresden (DE); Tom Herrmann, Saxony (DE); El Mehdi Bazizi, Saratoga Spring, NY (US); Richard Francis Taylor, III, Campbell, CA (US)

(73) Assignee: GLOBALFOUNDRIES U.S. Inc., Santa Clara, CA (US)

(*) Notice: Subject to any disclaimer, the term of this patent is extended or adjusted under 35 U.S.C. 154(b) by 0 days.

(21) Appl. No.: 16/373,620

(22) Filed: Apr. 2, 2019

(65) Prior Publication Data
US 2020/0321466 A1   Oct. 8, 2020

(51) Int. Cl.
*H01L 29/78* (2006.01)
*H01L 29/786* (2006.01)
*H01L 29/66* (2006.01)

(52) U.S. Cl.
CPC ...... *H01L 29/7835* (2013.01); *H01L 29/6656* (2013.01); *H01L 29/66659* (2013.01); *H01L 29/78603* (2013.01); *H01L 29/78624* (2013.01)

(58) Field of Classification Search
CPC .................................................. H01L 29/6656
See application file for complete search history.

(56) References Cited

U.S. PATENT DOCUMENTS

| | | | |
|---|---|---|---|
| 6,373,103 B1* | 4/2002 | Long | H01L 29/41733 257/347 |
| 9,799,524 B2 | 10/2017 | Ito et al. | |
| 2004/0137373 A1* | 7/2004 | Lei | H01L 21/823468 430/313 |
| 2008/0185662 A1 | 8/2008 | Yang | |
| 2009/0096026 A1 | 4/2009 | Bryant et al. | |
| 2015/0116029 A1 | 4/2015 | Litty et al. | |
| 2019/0051747 A1 | 2/2019 | Cortes Mayol et al. | |

* cited by examiner

*Primary Examiner* — Suberr L Chi
(74) *Attorney, Agent, or Firm* — Anthony Canale (57) ABSTRACT

The present disclosure relates generally to semiconductor structures, and more particularly to asymmetric field effect transistors (FET) on fully depleted silicon on insulator (FDSOI) semiconductor devices for high frequency and high voltage applications and their method of manufacture. The semiconductor device of the present disclosure includes a semiconductor-on-insulator (SOI) layer disposed above a substrate, the SOI layer having a source region, a channel region, a drift region and a drain region, where the drift region adjoins the drain region and the channel region, a gate structure disposed on the channel region, a multilayer drain spacer disposed on a drain-facing sidewall of the gate structure and covering the drift region, and a source spacer disposed on a source-facing sidewall of the gate structure, where the source and drain spacers are asymmetric with each other.

12 Claims, 9 Drawing Sheets

ASYMMETRIC FET FOR FDSOI DEVICES

FIELD OF THE INVENTION

The presently disclosed subject matter relates generally to semiconductor structures, and more particularly to asymmetric field effect transistors (FET) on fully depleted silicon on insulator (FDSOI) semiconductor devices for high frequency and high voltage applications and their method of manufacture.

BACKGROUND

Rapid advances in semiconductor technologies, driven by immense consumer demand, have resulted in dramatically increased packing densities and higher speeds of operation for device elements in integrated circuits (IC). The evolution of technologies to produce smaller and denser ICs has created several challenges. For example, the applicability of smaller and denser semiconductor devices in high voltage microelectronics has created a challenge with respect to breakdown voltages of those devices.

Development of fully depleted semiconductor on insulator (FDSOI) platforms for semiconductor devices can offer higher performance, improved electrostatics and current leakage control, as compared to semiconductor devices built on bulk silicon substrate platforms. Performance of FDSOI devices may be further improved, for example, by increasing their maximum frequency. One possible approach to increasing the maximum frequency is to decrease the gate length of transistors in the semiconductor device. However, the decrease in the gate length is found to reduce the breakdown voltage of the transistor. As a result, current FDSOI devices do not include high voltage capabilities at high-frequency applications, e.g., radio frequency, due to an inadequate breakdown voltage (i.e., too low of a breakdown voltage) in such devices being made with smaller process technologies. With an increasing need for higher operating voltages in transistors, there is a higher likelihood of an eventual breakdown of the transistors, which causes an uncontrollable increase in the current flow. Other exemplary detrimental effects of the transistor breakdown may include punch-through, avalanche breakdown, and gate oxide breakdown.

Therefore, there is a need to provide semiconductor devices that can overcome, or at least ameliorate, one or more of the disadvantages as described above.

SUMMARY

In one aspect of the present disclosure, there is provided a semiconductor device including a semiconductor-on-insulator (SOI) layer disposed above a substrate, the SOI layer having a source region, a channel region, a drift region and a drain region, where the drift region adjoins the drain region and the channel region, a gate structure disposed on the channel region, a multilayer drain spacer disposed on a drain-facing sidewall of the gate structure and covering the drift region, and a source spacer disposed on a source-facing sidewall of the gate structure, where the source and drain spacers are shaped asymmetrically when compared with each other.

In another aspect of the present disclosure, there is provided a semiconductor device including an SOI layer disposed above a substrate, the SOI layer having a source region, a channel region, a drift region, and a drain region, where the drift region adjoins the drain region and the channel region, a gate structure is disposed on the channel region, multilayer source and drain spacers are disposed on the source-facing and drain-facing sidewalls of the gate structure, respectively, where the drain spacer has a larger thickness than the source spacer, and the multilayer drain spacer is disposed on and covers the drift region.

In yet another aspect of the present disclosure, there is provided a method of forming a semiconductor device by providing a device structure having an SOI layer disposed above a substrate, and a gate structure disposed on the SOI layer, the gate structure having source-facing and drain-facing sidewalls, forming a multilayer structure to cover the gate structure and the SOI layer, and the multilayer structure has first, second and third spacer layers, performing isotropic etching on the multilayer structure to remove portions of the third spacer layer and the second spacer layer that are adjacent to the source-facing sidewall, and performing anisotropic etching on the multilayer structure to form a source spacer on the source-facing sidewall and a multilayer drain spacer on the drain-facing sidewall.

Advantageously, the multilayer drain spacer is found to enable the fabrication of a semiconductor device with a drift region in order to provide a higher breakdown voltage. Also advantageously, the configuration of the multilayer drain spacer over the drift region is found to help maintain a high drain-to-source voltage ($V_{ds}$) (e.g., more than 5V) at a desired maximum frequency ($f_{max}$) of operation. More advantageously, the integration of the drain and drift regions with the multilayer drain spacer is found to be fully compatible with FDSOI device fabrication.

Advantageously, the asymmetric source and drain spacers are also found to achieve significant breakdown voltage increase with low on-state resistance ($R_{on}$) degradation. Also advantageously, the present configuration of the semiconductor device elements is also found to enhance electric field distribution (i.e., lower electric field peak) during hot carrier injection (HCI) voltages, thereby leading to improved reliability of the device.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Figure 1:
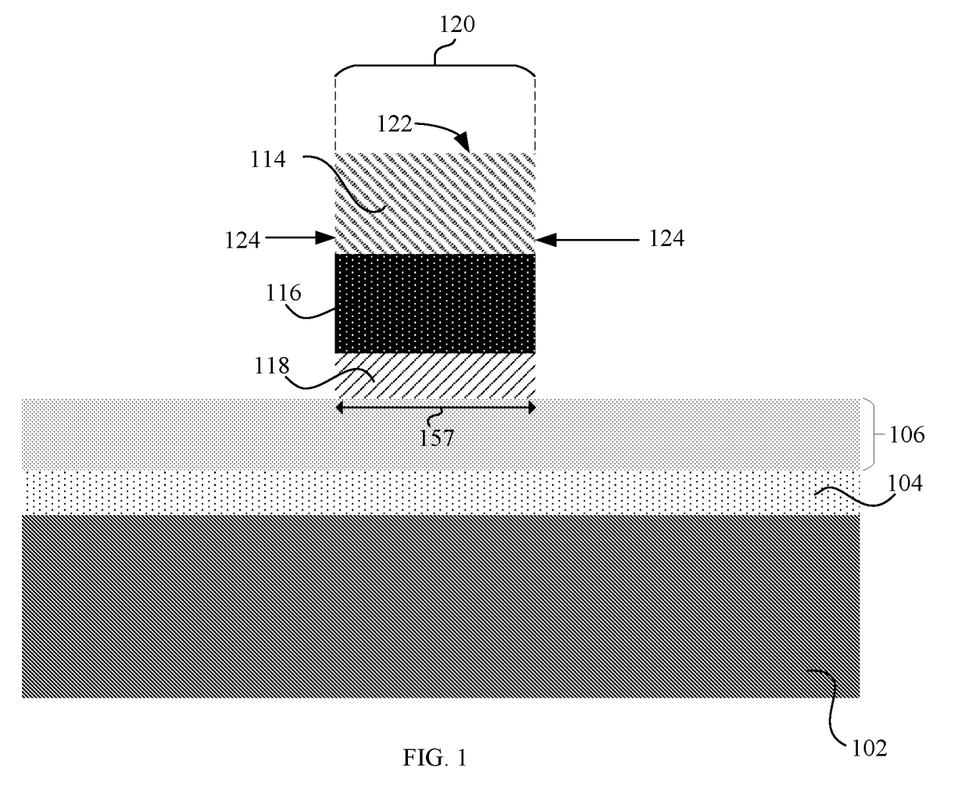
FIGS. 1-5 are schematic cross-section views depicting successive stages of forming a semiconductor device in accordance with embodiments of the present disclosure.

Referring to FIG. 1, a cross-section view of a device structure for forming a semiconductor device in accordance with the present disclosure is shown. The device structure shown in FIG. 1 illustrates one set of device elements targeted for use with embodiments of the present disclosure, and it should be understood that embodiments of the present disclosure can be implemented on different designs without any change to the techniques discussed herein. The device structure of FIG. 1 may be formed by conventional semiconductor fabrication processes.

The device structure may include a substrate 102, a semiconductor-on-insulator (SOI) layer 106 disposed above the substrate 102, and a gate structure 120 disposed on the SOI layer 106. As used herein, the term "semiconductor-on-insulator" refers to a semiconductor material that is disposed on an electrically insulating material (e.g., a dielectric material). For example, in FIG. 1, a buried insulator layer 104 is disposed on the substrate 102, and the SOI layer 106 is disposed thereon. The SOI layer 106 described herein may be a fully depleted SOI layer. The SOI layer 106 may be made of any semiconductor material, such as silicon (Si), germanium (Ge), silicon germanium (SiGe), or Si/SiGe. In one embodiment, the SOI layer 106 has a thickness in the range of about 4 nm to about 12 nm.

The gate structure 120 has a top surface 122 and sidewalls 124. The gate structure 120 may include a gate stack 118, a gate material 116 and a gate cap 114. In one embodiment, the gate structure 120 has a gate length 157 in the range of about 40 nm to about 80 nm, preferably in the range of about 60 nm to 80 nm. The gate stack 118 is disposed on the SOI layer 106. In some embodiments (not shown), the gate stack 118 includes a gate dielectric layer disposed on an interfacial dielectric layer (e.g., silicon dioxide). Examples of gate dielectric layers may include, but not limited to, hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. The gate cap 114 may include a nitride-containing compound, such as silicon nitride. Examples of the gate material 116 may include, but not limited to, polysilicon, tungsten, or titanium nitride (TiN).

The substrate 102 may be made of any semiconductor material, such as silicon (Si), germanium (Ge), silicon germanium (SiGe), or Si/SiGe. The substrate 102 may include a P-type well, an N-type well, or a combination of N-type and P-type wells. Examples of the combination of N-type and P-type wells may include an N-type well flanked by P-type wells, a P-type well flanked by N-type wells, or alternating P-type and N-type wells.

The buried insulator layer 104 may include a dielectric material. The dielectric material may also exhibit ferroelectric properties that enhance the operation and control of the subsequently formed device. Examples of dielectric materials that may be used as the buried insulator layer 104 include, but not limited to, germanium oxide, SiGe oxide, silicon oxynitride (SiON), silicon nitride (Si$_3$N$_4$), silicon dioxide (SiO$_2$), carbon-doped silicon dioxide materials; fluorinated silicate glass (FSG); boro-phospho-silicate glass (BPSG); organic polymeric thermoset materials; silicon oxycarbide; SiCOH dielectrics; fluorine-doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, or combinations of these materials.

A multilayer structure is formed over the device structure of FIG. 1. The multilayer structure is made of dielectric materials, including, for example, nitride-containing compounds and oxide-containing compounds. The multilayer structure may include a first spacer layer, a second spacer layer, and third spacer layer. The multilayer structure may be formed by conformal deposition of the first spacer layer, followed by the second spacer layer, and thereafter the third spacer layer.

Figure 2:
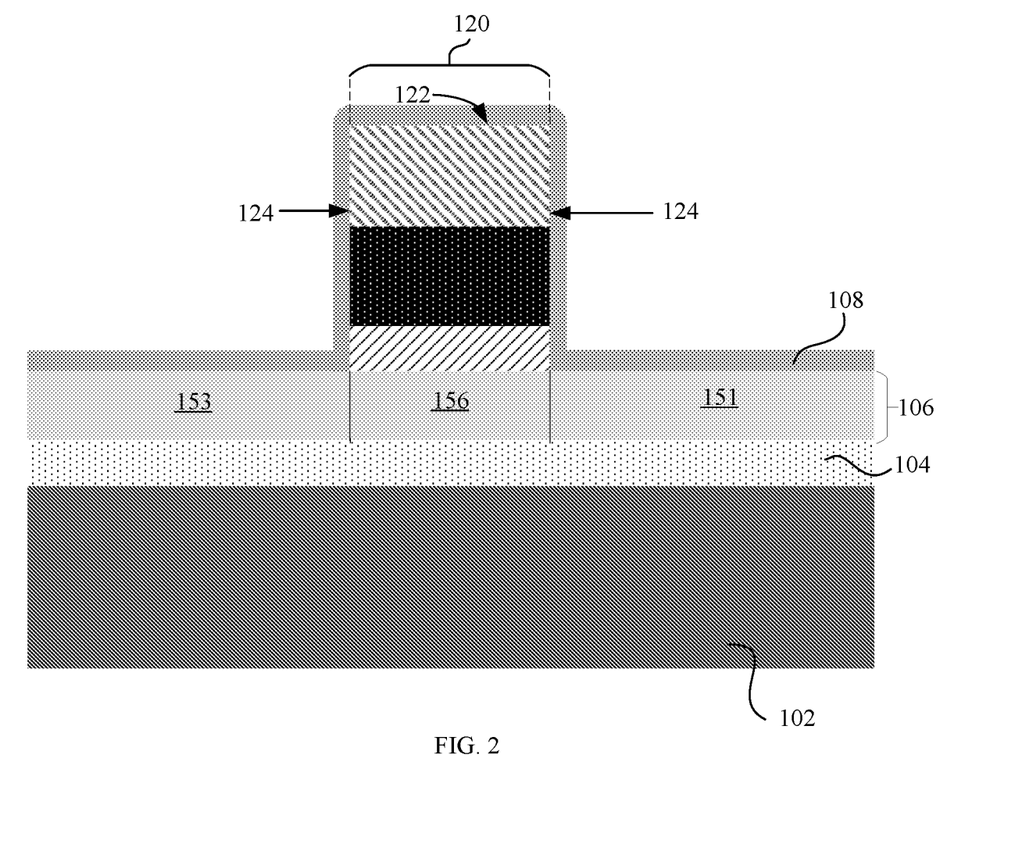

Referring to FIG. 2, a first spacer layer 108 is formed on the device structure. The first spacer layer 108 may be deposited by conventional deposition processes, such as chemical vapor deposition (CVD). The first spacer layer 108 covers the top surface 122 and sidewalls 124 of the gate structure 120, and the SOI layer 106. The first spacer layer 108 includes a low-K dielectric material, such as a nitride-containing compound, silicon nitride, or silicon nitride that is doped or enriched with elements selected from the group consisting of boron, carbon, and oxygen (e.g., SiBCN or SiOCN). In the present device, SiBCN is the preferred low-K dielectric material because SiBCN is a softer material with a lower permittivity and higher porosity relative to silicon nitride. In one embodiment, the first spacer layer 108 has a thickness in the range of about 2 nm to about 15 nm.

A first doping step is performed to dope the SOI layer 106 through the first spacer layer 108. The SOI layer 106 may be doped by an ion implantation technique with the use of an implantation mask (not shown) and with a suitable dopant of one conductivity type, such as an N-type dopant (e.g. arsenic, phosphorus, or antimony) or a P-type dopant (e.g. boron, aluminum, or gallium).

As shown in FIG. 2, the doped SOI layer 106 has a predetermined channel region 156 positioned below and covered by the gate structure 120. The channel region 156 is flanked by a predetermined source-side portion 153 of the SOI layer 106 and a pre-determined drain-side portion 151 of the SOI layer 106. The source-side portion 153 and the drain-side portion 151 may have the same dopant concentration and conductivity type (e.g., P-type or N-type). On the other hand, the channel region 156 may be "intrinsically doped", having the lowest dopant concentration in the SOI layer 106. The pre-determined source-side and drain-side portions (153 and 151, respectively) correspond to sides of the device structure in which the respective source and drain (not shown) will be formed at a later stage of the fabrication process.

As used herein, "intrinsic doped" refers to a doped region that is substantially free of extrinsic doping atoms but may still contain charge carriers provided by other doped portions of the structure.

Figure 3:
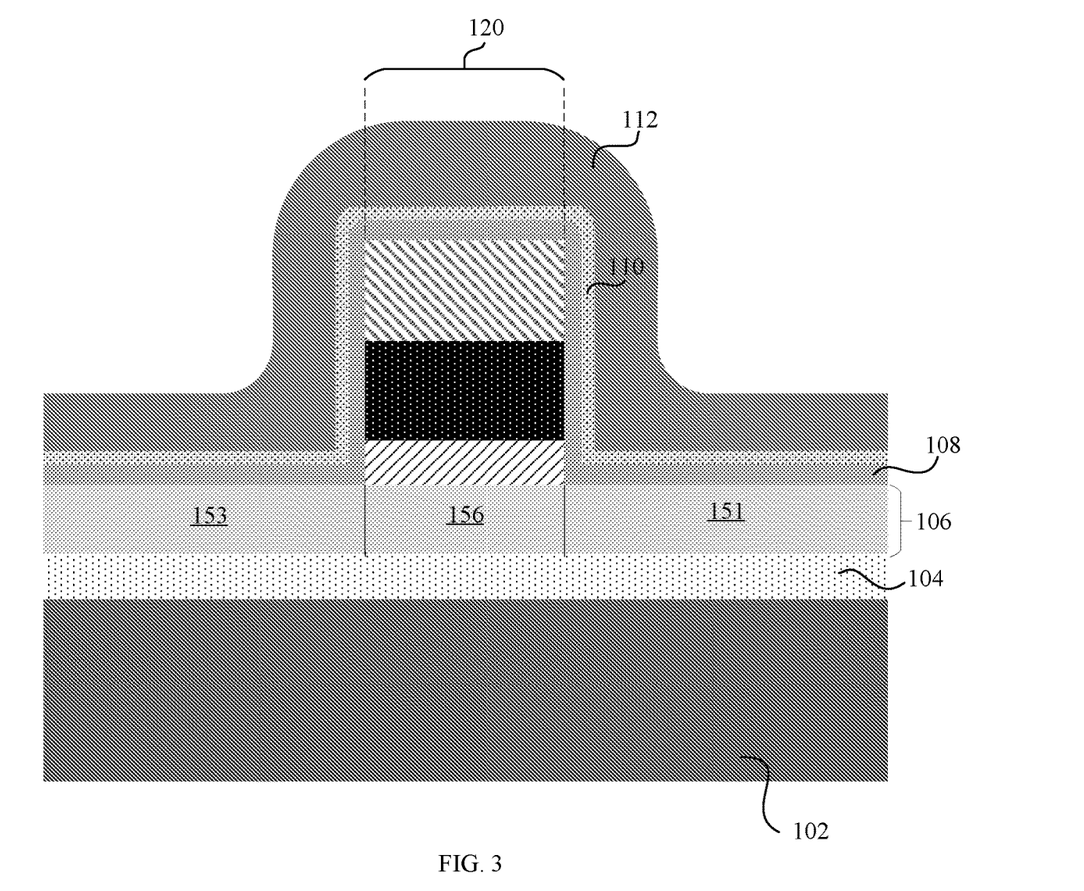

Referring to FIG. 3, a second spacer layer 110 and a third spacer layer 112 are formed on the first spacer layer 108. The second spacer layer 110 and the third spacer layer 112 may be deposited by conventional deposition processes, such as CVD. The third spacer layer 112 may have a larger thickness than the second spacer layer 110. Alternatively, the second spacer layer 110 may have a larger thickness than the third spacer layer 112. The second spacer layer 110 and the third spacer layer 112 may include a nitride-containing compound (e.g., silicon nitride), or an oxide-containing compound (e.g., silicon dioxide, silicon oxynitride, tetraethyl orthosilicate (TEOS), silicon-rich silicon oxide). The nitride-containing compound in the second spacer layer 110 or the third spacer layer 112 may also be a low-K dielectric material, such as silicon nitride that is doped or enriched with elements selected from the group consisting of boron, carbon, and oxygen (e.g., SiBCN or SiOCN). In one embodiment, the second spacer layer 110 has a thickness in the range of about 2 nm to about 15 nm. In another embodiment, the third spacer layer 112 has a thickness in the range of about 10 nm to about 40 nm. In particular, the third spacer layer 112 has a preferred thickness in the range of about 25 nm to about 30 nm.

Figure 4:
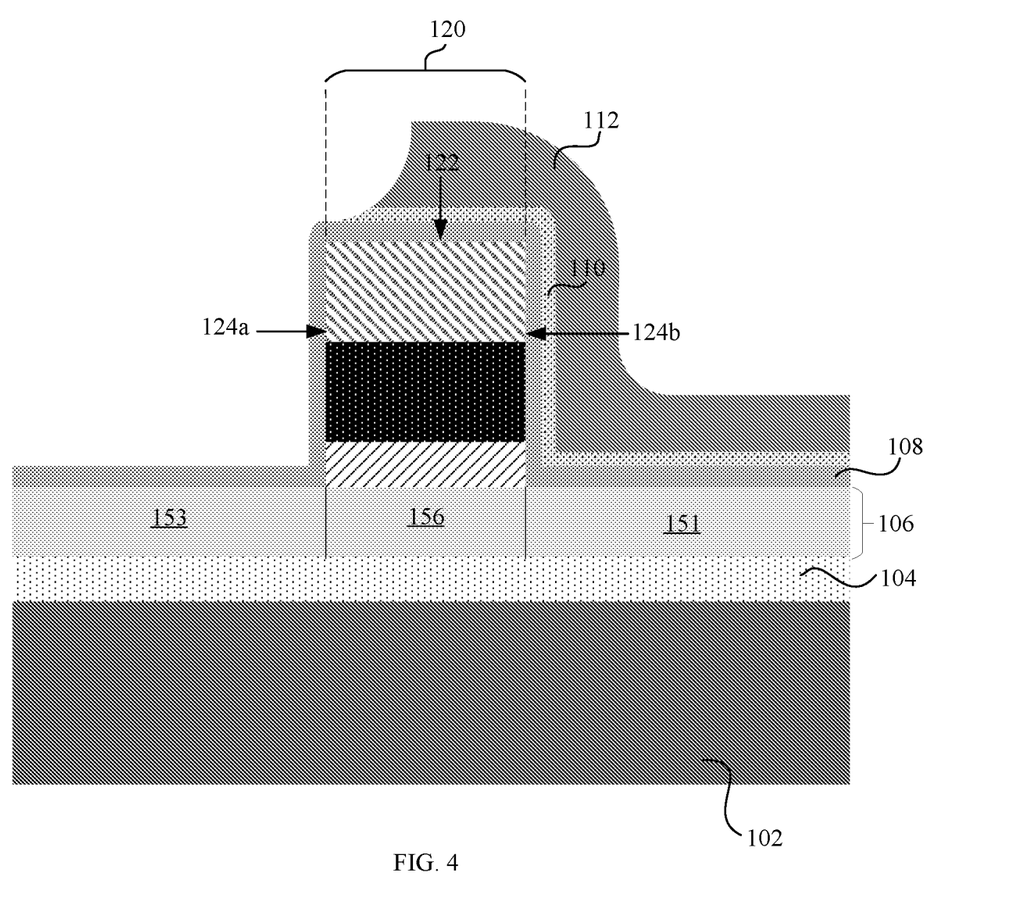

The multilayer structure is etched to form a pair of asymmetric spacers on source-facing and drain-facing sidewalls (124a and 124b, respectively) of the gate structure 120. As shown in FIG. 4, the source-side portion 153 of the SOI layer 106 is adjacent to the source-facing sidewall 124a, while the drain-side portion 151 of the SOI layer 106 is adjacent to the drain-facing sidewall 124b.

Referring to FIG. 4, the third spacer layer 112 and the second spacer layer 110 are partially removed by isotropic etching. In one embodiment, the isotropic etching removes portions of the third spacer layer 112 and the second spacer layer 110 that are adjacent to the source-facing sidewall 124a. The isotropic etching may be performed using a wet etch process. Although not shown in the accompanying drawings, the isotropic etching may require the use of a mask or a patterned photoresist. The partial removal of the second and third spacer layers (110 and 112, respectively) exposes a portion of the first spacer layer 108 that is deposited on the source-facing sidewall 124a of the gate structure 120, and a portion of the first spacer layer 108 that is covering the source-side portion 153 of the SOI layer 106. Accordingly, portions of the third spacer layer 112 and the second spacer layer 110 that are adjacent to the drain-facing sidewall 124b and overlying the top surface 122 of the gate structure remain after the isotropic etching, as shown in FIG. 4.

Figure 5:
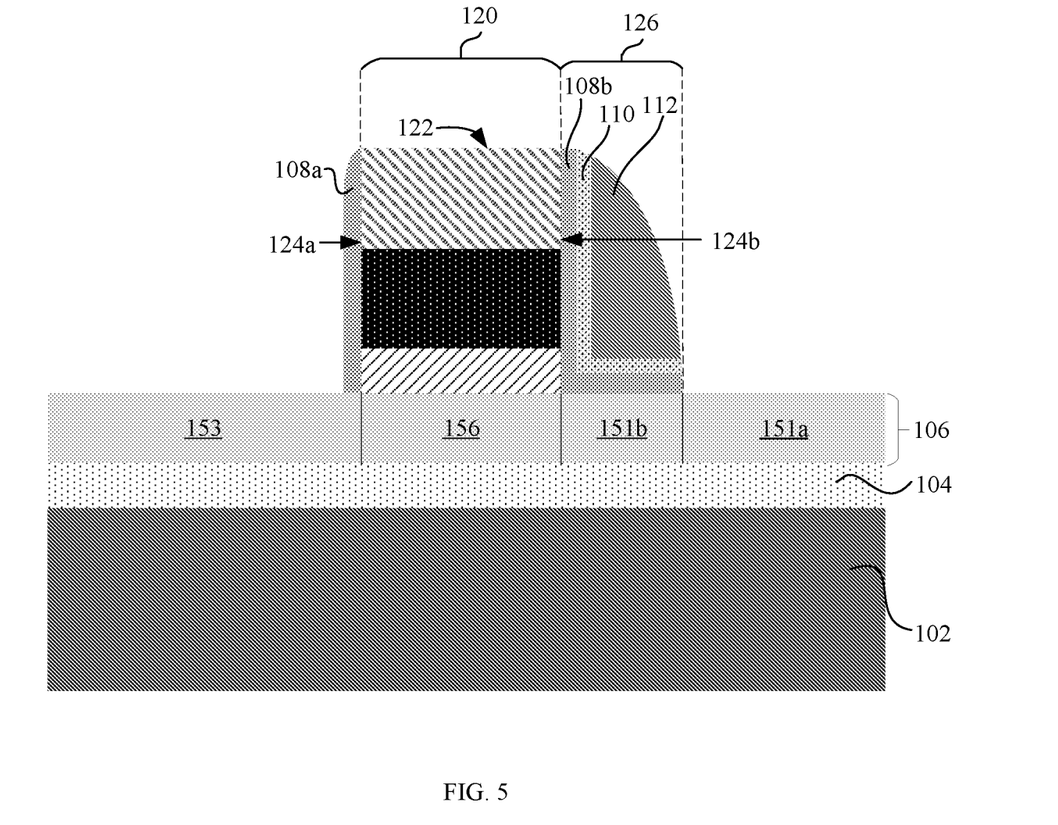
Figure 6:
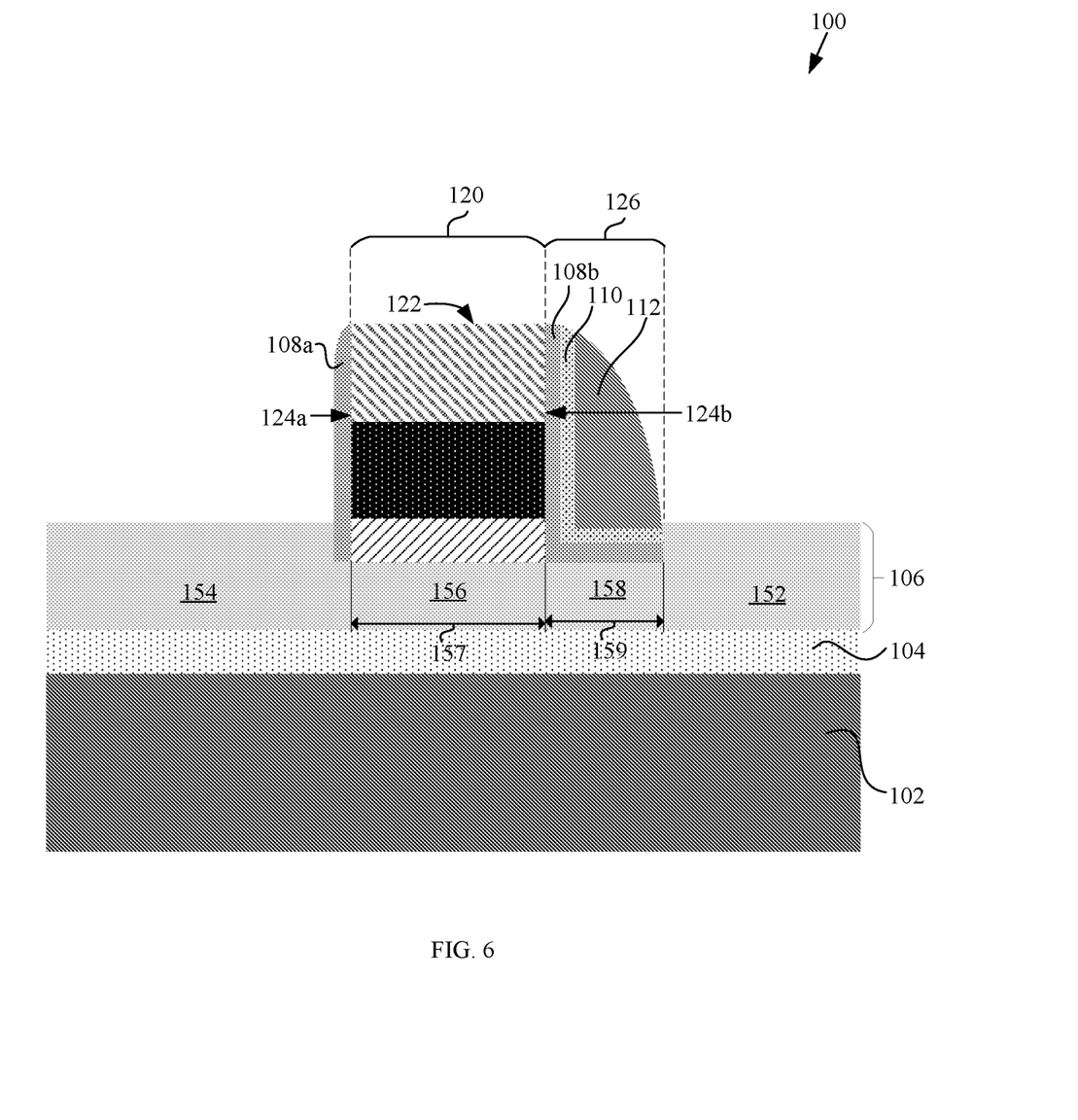
FIGS. 6-8 are cross-section views depicting various embodiments of the semiconductor device in accordance with the present disclosure.

FIGS. 5-6 illustrate successive stages of forming one embodiment of the semiconductor device in accordance with the present disclosure. The semiconductor device is formed by performing anisotropic etching (e.g., using reactive ion etching (ME) or ion beam etching (IBE) techniques) on the device structure of FIG. 4. The anisotropic etching exposes the source-side 153 and drain-side 151a portions of the SOI layer 106, and also exposes the top surface 122 of the gate structure, as shown in FIG. 5.

Referring to FIG. 5, the anisotropic etching removes a portion of the first spacer layer 108a overlying the source-side portion 153 of the SOI layer 106 and retains a portion of the first spacer layer 108a disposed on the source-facing sidewall 124a of the gate structure 120, thereby forming a source spacer. The source spacer disclosed herein may include a single layer structure or a multilayer structure. In the embodiment shown in FIG. 5, the source spacer has a single layer structure.

The anisotropic etching also removes portions of the multilayer structure such that a portion of the multilayer structure on the drain-facing sidewall 124b of the gate structure 120 is retained, which forms a multilayer drain spacer 126. For example, the multilayer drain spacer 126 includes residual portions of the first spacer layer 108b, the second spacer layer 110, and the third spacer layer 112 after the anisotropic etching. The multilayer drain spacer 126 covers a portion 151b of the SOI layer adjacent and proximal to the drain-facing sidewall 124b of the gate structure 120.

Referring to FIG. 6, the embodiment of the semiconductor device 100 is shown. A second doping step is performed (using dopants as described herein below) to dope portions of the SOI layer 106 that are uncovered by the source and drain spacers and the gate structure 120, thereby forming source and drain regions. For example, the uncovered source-side portion 153 of the SOI layer 106 is doped to form a source region 154 that is adjacent to the source spacer, and the uncovered drain-side portion 151a of the SOI layer 106 is doped to form a drain region 152 adjacent to the multilayer drain spacer 126, as shown in FIG. 6. Additionally, the source and drain regions (154 and 152, respectively) is raised by growing epitaxial layers on the exposed SOI layer 106 with in-situ doping thereof. The epitaxial layers may include any semiconductor material (e.g. silicon, germanium, SiGe). The formed drain region 152 is spaced apart from the channel region 156 by the multilayer drain spacer 126. The portion of the SOI layer 106 that is covered by the multilayer drain spacer 126 (as indicated by reference numeral 151b in FIG. 5) is protected from the second doping step (and any epitaxial growth), thereby becoming a drift region 158.

The source and drain regions (154 and 152, respectively) may be "heavily doped", while the drift region 158 may be "lightly doped". As used herein, "heavily doped" refers to a doped region having the highest dopant concentration (e.g., N++ doped or P++ doped region) and "lightly doped" refers to a doped region having a medial dopant concentration (e.g., N+ doped or P+ doped region) relative to the "heavily doped" and the "intrinsic doped". In one embodiment, the source and drain regions (154 and 152, respectively) have a dopant concentration in the range of about $1e^{20}$ to about $1e^{21}$ atoms/cm$^3$. In some embodiments, an annealing process is performed to control diffusion of the dopants in the SOI layer 106.

The drift region 158 is positioned between and adjoining the drain region 152 and the channel region 156. The drift region 158 may function as a "transitional" region between the channel and drain regions and may be "lightly doped" to ensure that the performance or current carrying capability of the device is not compromised. In one embodiment, the drift region 158 has a dopant concentration in the range of about $1e^{18}$ to about $5e^{19}$ atoms/cm$^3$. The drift region 158 has the same conductivity type as that of the source and drain regions (154 and 152, respectively). In another embodiment, the drift region 158 is preferably N-type doped. In another embodiment, the drift region 158 is covered only by the multilayer drain spacer 126, and has a length in the range of about 20 nm to about 60 nm. Additionally, the drift region 158 is uncovered by the gate structure 120.

Advantageously, the dimensions (e.g., length) of the gate structure 120 and the drift region 156 is found to provide significant reduction of gate-drain capacitance ($C_{gd}$) with low saturation transconductance ($g_{m,sat}$) degradation, thereby boosting the maximum frequency ($f_{max}$) and unity frequency gain ($f_t$) of the device. For example, by keeping the gate length 157 in the range of 40 to 80 nm and/or the length 159 of the drift region 158 in the range of 20 to 60 nm, it is found that the $f_{max}$ and $f_t$ of the device can be boosted to frequency values above 250 GHz and 100 GHz, respectively.

Also advantageously, the presence of the multilayer drain spacer 126 enables the formation of the drain region 152 to be offset or distal from the gate structure 120, and also prevents unwanted epitaxial growth and dopant implantation on the drift region 158.

As shown in FIG. 6, the source and drain spacers have sidewall profiles that taper towards the top surface 122 of the gate structure 120. The multilayer drain spacer 126 may include at least three spacer layers that are substantially overlying the drift region 158. In one embodiment, the multilayer drain spacer 126 includes a nitride/oxide/nitride (NON) or a nitride/nitride/oxide (NNO) combination of spacer layers.

Advantageously, the presence of at least three spacer layers in the multilayer drain spacer 126 is found to enable epitaxial growth of different materials on selected areas of the SOI layer 106 for the purposes of co-integrating P-channel field effect transistor (PFET) and N-channel field effect transistor (NFET) devices. More advantageously, the presence of at least three spacer layers provides thicker and better protection against unwanted epitaxial growth or dopant implantation on the SOI layer 106 during the co-integration processes.

The multilayer drain spacer 126 has a tapered thickness. In one embodiment, the thickness of the multilayer drain spacer 126 increases from a top edge to a bottom edge. In particular, the anisotropic etching results in the residual second spacer layer 110 and third spacer layer 112 to have tapered thicknesses. In the embodiment, the largest thickness of the multilayer drain spacer 126 corresponds to the length 159 of the drift region 158. In another embodiment, the multilayer drain spacer 126 has a thickness in the range of about 20 nm to about 60 nm.

The multilayer drain spacer 126 has a larger thickness than the source spacer.

Advantageously, the presence of a thicker spacer on the drain-facing sidewall 124b of the gate structure 120 is found to achieve a significant increase in the breakdown voltage of the formed semiconductor device, thereby improving its performance capabilities.

Within the multilayer drain spacer 126, the first spacer layer 108b may have "L" shaped geometry. For example, the first spacer layer 108b contacts the drain-facing sidewalls 124b and is disposed on the drift region 158. In some embodiments, the second spacer layer 110 conforms to the first spacer layer 108b, thereby having the "L" shaped geometry as well. It is advantageous for the first and second spacer layers (108b and 110, respectively) to have "L" shaped geometry so as to provide additional protection to the drift region 158 during subsequent fabrication steps. In one embodiment, the third spacer layer 112 within the multilayer drain spacer 126 has a thickness in the range of about 5 nm to about 30 nm, or preferably about 5 nm to about 25 nm, after the etching steps.

Advantageously, the second spacer layer 110 may function as a protection layer for device elements (e.g., the drift region, the SOI layer, etc.) that are formed above the substrate during downstream fabrication processes. For example, the second spacer layer 110 is found to protect the drift region from further epitaxial growth and/or dopant implantation during subsequent steps to co-integrate NFET and PFET devices.

Figure 7:
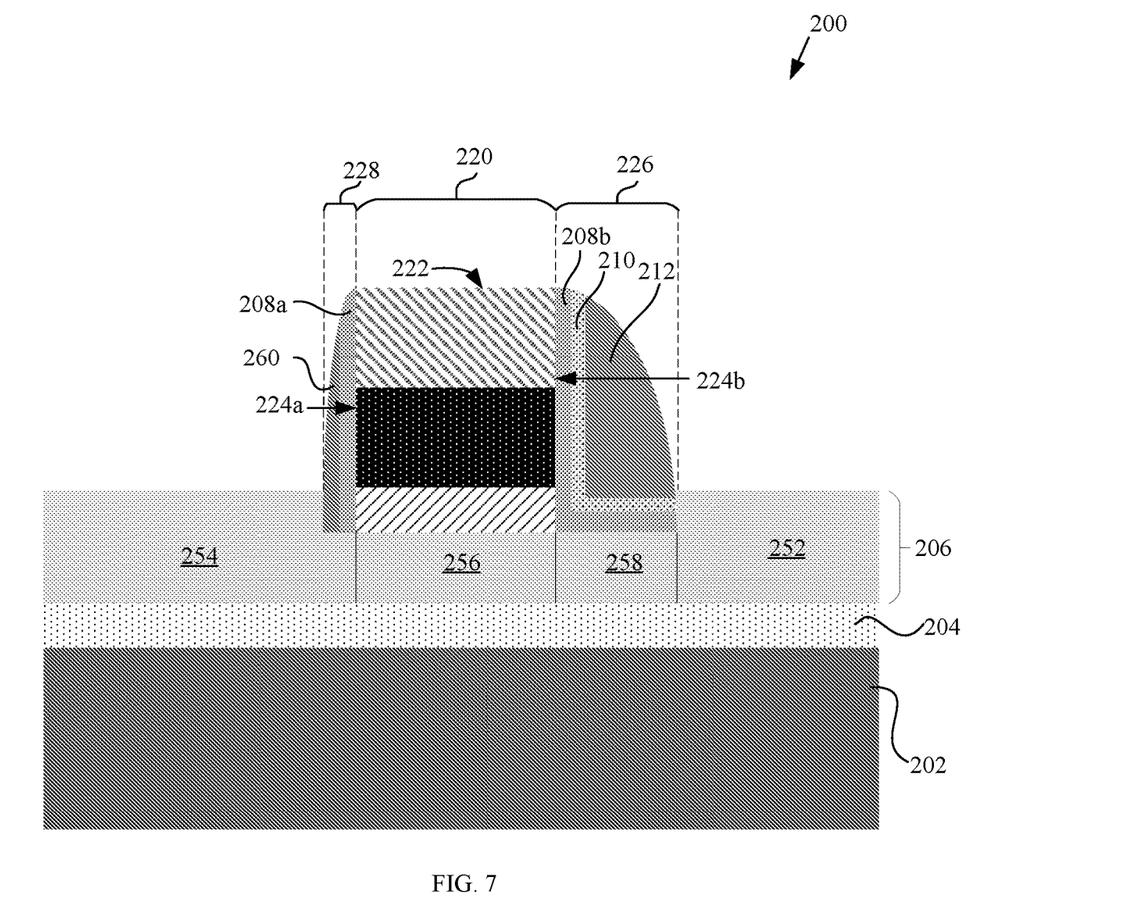

FIG. 7 illustrates an alternative embodiment of the semiconductor device 200 in accordance with the present disclosure. The semiconductor device 200 is formed in a similar manner as described in FIGS. 5-6. The semiconductor device 200 has a source spacer 228 disposed on the source-facing sidewall 224a of the gate structure 220. In the embodiment shown in FIG. 7, the source spacer 228 has a multilayer structure. For example, an outer spacer layer 260 is disposed on the first spacer layer 208a. The outer spacer layer 260 may be formed by additional steps of depositing (e.g., CVD) a dielectric material adjacent to the first spacer layer 208a and etching thereof. In one embodiment, the outer spacer layer 260 includes a nitride-containing compound (e.g., silicon nitride). The thickness of the source spacer 228 may be adjusted by controlling the amount of dielectric material removed by the etching. It should be understood that the formation of the outer spacer layer 260 may include deposition of material or photoresist, patterning, exposure, development, etching, cleaning, and/or removal of the material or photoresist as required. In the embodiment shown in FIG. 7, the outer spacer layer 260 has a thickness in the range of about 2 nm to about 8 nm.

The source spacer 228 is disposed on and covering a portion of the SOI layer 206 adjacent and proximal to the source-facing sidewall 224a. As described herein, uncovered portions of the SOI layer 206 are further doped to form source and drain regions (254 and 252, respectively). As shown in FIG. 7, the source and drain regions (254 and 252, respectively) are raised by epitaxial growth of a semiconductor material (e.g. silicon, germanium, SiGe) on the uncovered portions of the SOI layer 206, with in-situ doping thereof.

The addition of an outer spacer layer 260 to the source spacer 228 may improve co-integration of PFET and NFET devices on a semiconductor substrate. As co-integration of NFET and PFET devices require different gate spacer thicknesses for device performance and semiconductor processing requirements, it is advantageous to include the outer spacer layer 260 in the source spacer 228 to modulate the relative positioning of PFET and NFET devices.

Figure 8:
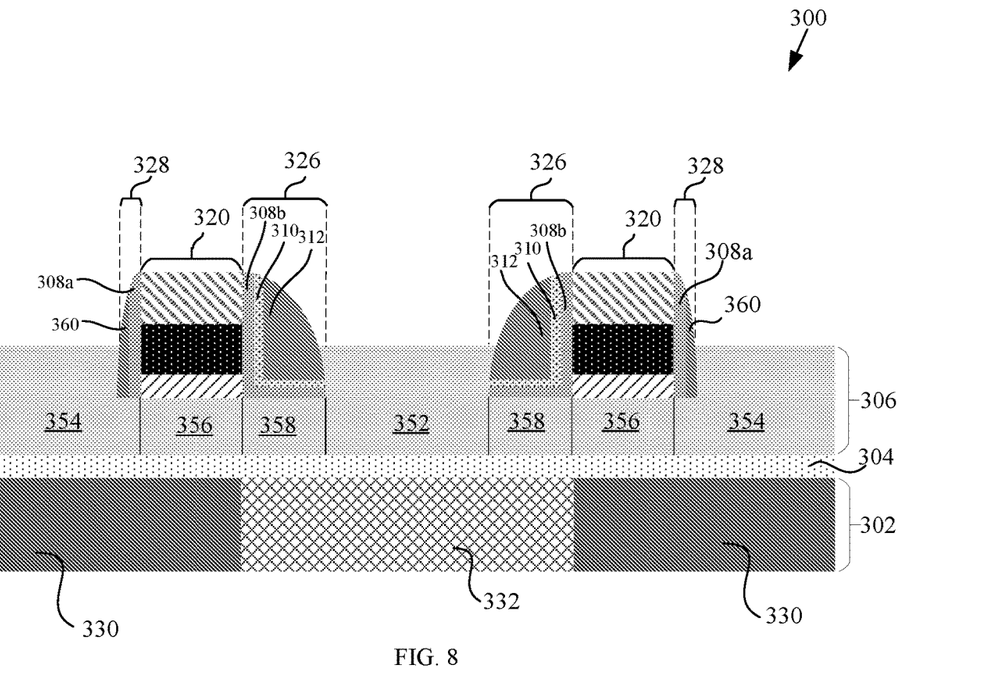

FIG. 8 illustrates another embodiment of the semiconductor device 300 in accordance with the present disclosure. The semiconductor device 300 is formed in a similar manner as described in FIGS. 5-7. The semiconductor device 300 includes a substrate 302, a buried insulator layer 304 disposed on the substrate 302, an SOI layer 306 disposed on buried insulator layer 304 and at least one gate structure 320 formed on the SOI layer 306. Each gate structure 320 has a source spacer 328 formed on a source-facing sidewall and a multilayer drain spacer 326 formed on a drain-facing sidewall. The source and drain spacers are shaped asymmetrically when compared with each other and have multilayer structures. The SOI layer 306 includes source regions 354, drain regions 352, channel regions 356, and drift regions 358. Each gate structure 320 is disposed on and covering a channel region 356. Each multilayer drain spacer 326 is disposed on and covering a drift region 358. Each source region is adjacent to the source spacer 328 and each drain region 352 is adjacent to the multilayer drain spacer 326.

As shown in FIG. 8, the substrate 302 includes an N-type well 332 flanked by P-type wells 330. The P-type and N-type wells may be formed before the formation of the gate structure 320 on the SOI layer 306. For example, the substrate 302 may be doped by an ion implantation technique with the use of an implantation mask. Also shown in FIG. 8, each drain region 352 is flanked by drift regions 358. In one embodiment, the N-type well 332 is positioned below the drift region 358. The drift and drain regions (358 and 352, respectively) are additionally N-type doped. In another embodiment, the interface between the drift region 358 and the channel region 356 is aligned with the interface between the N-type well 332 and the P-type well 330, as shown in FIG. 8.

Advantageously, the alignment of the N-type well 332 with the drift and drain regions (358 and 352, respectively) is found to reduce the electric field in the drift region by modulating positive biasing of the N-well, thereby boosting the device performance. More advantageously, a combination of alternating P-wells and N-wells is found to increase the threshold voltage of the device, for example, by having the P-well to be positioned below a source region.

The embodiments of the semiconductor device described in FIGS. 5 to 8 may be subjected to further semiconductor processing. Examples of further processing may include replacement metal gate (RMG) processes, rapid thermal annealing (RTA), silicidation (i.e., silicide process) of the source and drain regions (154, 254, 354 and 152, 252, 352, respectively) and the gate structure 120, 220, and 320, formation of contact etch stop layers, and formation of conductive contacts on the source and drain regions (154, 254, 354 and 152, 252, 352, respectively) and the gate structure 120, 220, and 320.

Figure 9:
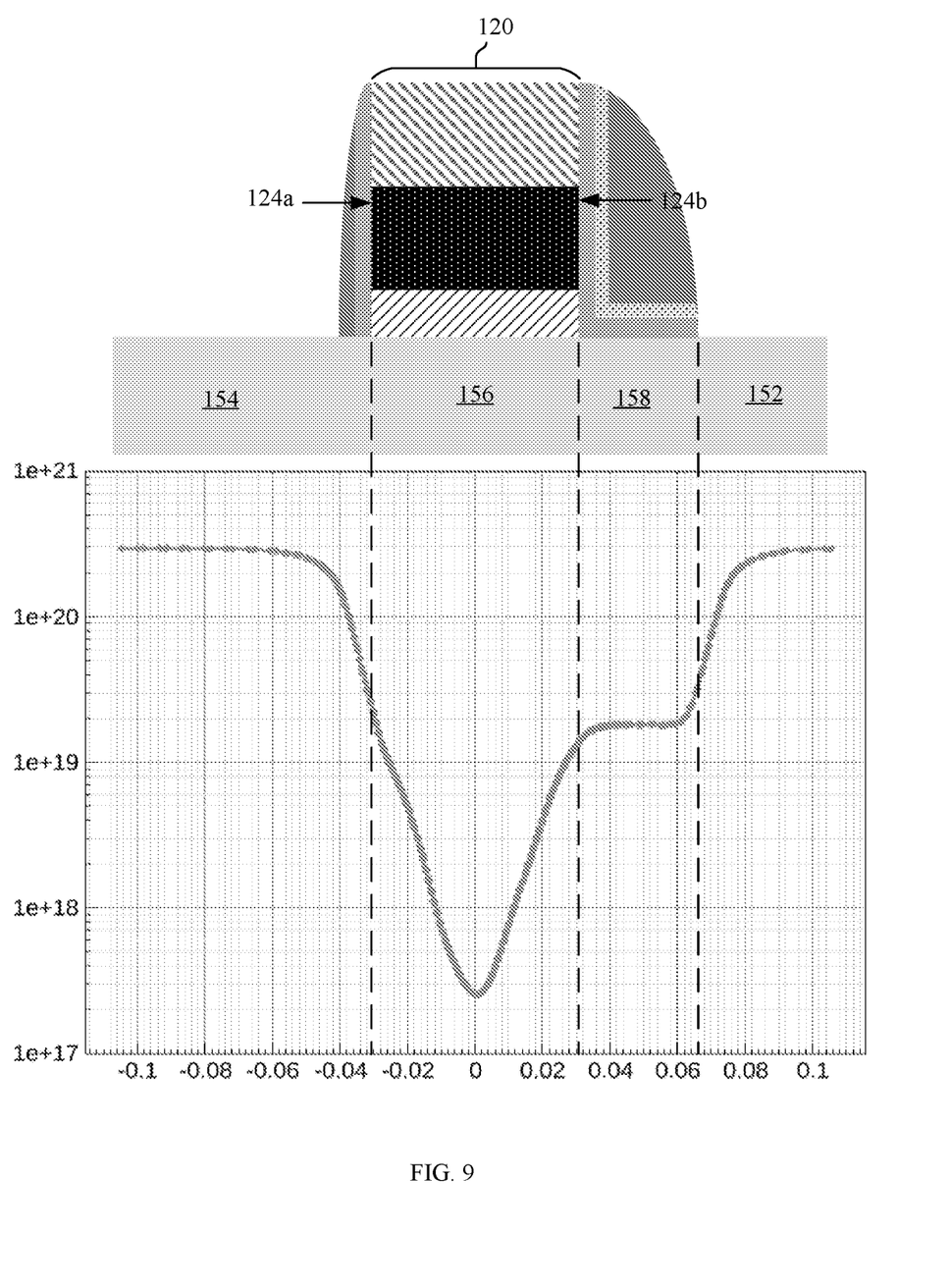
FIG. 9 illustrates an exemplary dopant concentration profile of the SOI layer in the semiconductor device in accordance with embodiments of the present disclosure.

FIG. 9 illustrates an example of the dopant concentration profile in the SOI layer 106 in accordance with embodiments of the present disclosure. FIG. 9 depicts the dopant concentration profile plotted with respect to the positioning of the source 154, channel 156, drift 158 and drain 152 regions in the SOI layer 106. The dopant concentration profile shown in FIG. 9 is obtained after performing an annealing process. The vertical axis of the graph indicates the dopant concentration in a logarithmic scale (with units in atoms/cm$^3$), while the horizontal axis indicates the displacement (i.e., positioning) measured in "μm" from the "0" point (hereinafter referred to as the "origin") on the axis.

With reference to FIG. 9, the midpoint of the channel region 156 and the gate structure 120 is aligned with the origin position on the horizontal axis. At the origin position, the dopant concentration has the lowest value of about $2e^{17}$ atoms/cm$^3$. The dopant concentration in the channel region 156 increases as the displacement from the origin increases, to a dopant concentration of about $2e^{19}$ atoms/cm$^3$ (displaced about ±0.03 μm from the origin), before transitioning to either the source region 154 or the drift region 158. In the source region 154, the dopant concentration increases sharply from about $2e^{19}$ atoms/cm$^3$ to about $2e^{20}$ atoms/cm$^3$ before the trend line plateaus at about $3e^{20}$ atoms/cm$^3$. In the drift region 158, the dopant concentration remains substantially constant (e.g., at about $2e^{19}$ atoms/cm$^3$) with a displacement of about +0.025 μm to about +0.063 μm from the origin. In the drain region 152, the dopant concentration increases sharply before plateauing at a value of at $3e^{20}$ atoms/cm$^3$.

As used herein, the term "deposition processes" generally refers to the process of applying a material over another material (or the substrate). Exemplary techniques for deposition include, but are not limited to, CVD, physical vapor deposition (PVD), sputtering, or spin-coating.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor isolation structures and methods of manufacture disclosed herein may be used in association with a variety of different integrated circuit products, including, but not limited to, FDSOI based devices, CMOS, bipolar, and a combination of bipolar and CMOS (BiCMOS) semiconductor devices, etc.

What is claimed is:

1. A semiconductor device comprising:
a semiconductor-on-insulator (SOI) layer disposed above a substrate, the SOI layer comprising a source region, a channel region, a drift region and a drain region, wherein the drift region adjoins the drain region and the channel region;
a gate structure disposed on the channel region;
a multilayer drain spacer disposed on a drain-facing sidewall of the gate structure and covering the drift region, wherein the multilayer drain spacer comprises at least three spacer layers overlying the drift region; and
a source spacer disposed on a source-facing sidewall of the gate structure, the source spacer comprising a single layer, wherein the source and drain spacers are shaped asymmetrically when compared with each other.

2. The device of claim 1, wherein the multilayer drain spacer comprises first, second and third spacer layers.

3. The device of claim 2, wherein the first spacer layer contacts the drain-facing sidewall of the gate structure and is disposed on the drift region.

4. The device of claim 3, wherein the second spacer layer is on the first spacer layer, and the third spacer layer is on the second spacer layer.

5. The device of claim 4, wherein the second spacer layer conforms to the first spacer layer, and the second spacer layer has a L shaped geometry.

6. The device of claim 4, wherein the multilayer drain spacer has a tapered thickness that increases from a top edge to a bottom edge.

7. The device of claim 1, wherein the drift region has a dopant concentration in the range of $1e^{18}$ atoms/cm$^3$ to $5e^{19}$ atoms/cm$^3$.

8. The device of claim 1, wherein the drift region has a length in the range of 20 nm to 60 nm.

9. The device of claim 1, further comprising an outer spacer layer disposed on the source spacer.

10. The device of claim 1, wherein the substrate comprises an N-type well flanked by P-type wells.

11. The device of claim 10, wherein the N-type well is positioned below the drift region.

12. The device of claim 1, wherein the SOI layer is a fully depleted SOI layer.

* * * * *